(12) United States Patent
Eun et al.

(10) Patent No.: US 8,110,902 B2
(45) Date of Patent: Feb. 7, 2012

(54) CHIP PACKAGE AND MANUFACTURING METHOD THEREOF

(75) Inventors: Younghyo Eun, Kyunggi-Do (KR); Dukman Kim, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 135 days.

(21) Appl. No.: 12/388,761

(22) Filed: Feb. 19, 2009

(65) Prior Publication Data

US 2010/0207258 A1  Aug. 19, 2010

(51) Int. Cl.
*H01L 23/552* (2006.01)
(52) U.S. Cl. .................. 257/659; 257/660
(58) Field of Classification Search ............ 257/659, 257/660, 687, 691, 692, 787, E21.499, E23.114
See application file for complete search history.

(56) References Cited

U.S. PATENT DOCUMENTS

| | | |
|---|---|---|
| 3,390,226 A | 6/1968 | Beyerlein |
| 4,569,786 A | 2/1986 | Deguchi |
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,497,033 A | 3/1996 | Fillion et al. |
| 5,557,142 A | 9/1996 | Gilmore et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A | 12/1997 | Heiss |
| 5,726,612 A | 3/1998 | Mandai |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |

(Continued)

FOREIGN PATENT DOCUMENTS

CN 1442033 A 9/2003

(Continued)

OTHER PUBLICATIONS

An et al."Semiconductor Device Packages with Electromagnetic Interference Shielding" U.S. Appl. No. 12/432,621, filed Apr. 29, 2009.

(Continued)

*Primary Examiner* — Hung Vu
(74) *Attorney, Agent, or Firm* — Cooley LLP

(57) ABSTRACT

A chip package including at least a shielding layer for better electromagnetic interferences shielding is provided. The shielding layer disposed over the top surface of the laminate substrate can protect the chip package from the underneath EMI radiation. The chip package may further include another shielding layer over the molding compound of the chip package.

18 Claims, 4 Drawing Sheets

U.S. PATENT DOCUMENTS

| | | |
|---|---|---|
| 5,998,867 A | 12/1999 | Jensen et al. |
| 6,079,099 A | 6/2000 | Uchida et al. |
| 6,093,972 A | 7/2000 | Carney et al. |
| 6,150,193 A | 11/2000 | Glenn |
| 6,194,250 B1 | 2/2001 | Melton et al. |
| 6,225,694 B1 | 5/2001 | Terui |
| 6,255,143 B1 | 7/2001 | Briar |
| 6,261,680 B1 | 7/2001 | Denman |
| 6,369,335 B1 | 4/2002 | Wajima |
| 6,376,769 B1 | 4/2002 | Chung |
| 6,448,632 B1 | 9/2002 | Takiar et al. |
| 6,455,864 B1 | 9/2002 | Featherby et al. |
| 6,472,598 B1 | 10/2002 | Glenn |
| 6,472,743 B2 | 10/2002 | Huang et al. |
| 6,479,903 B2 | 11/2002 | Briar |
| 6,492,194 B1 | 12/2002 | Bereau et al. |
| 6,521,978 B2 | 2/2003 | Fenk et al. |
| 6,566,596 B1 | 5/2003 | Askew |
| 6,586,822 B1 | 7/2003 | Vu et al. |
| 6,602,737 B2 | 8/2003 | Wu |
| 6,614,102 B1 | 9/2003 | Hoffman et al. |
| 6,635,953 B2 | 10/2003 | Wu |
| 6,686,649 B1 | 2/2004 | Mathews et al. |
| 6,695,985 B2 | 2/2004 | Igarashi et al. |
| 6,740,546 B2 | 5/2004 | Corisis et al. |
| 6,740,959 B2 | 5/2004 | Alcoe et al. |
| 6,757,181 B1 | 6/2004 | Villanueva et al. |
| 6,781,231 B2 | 8/2004 | Minervini |
| 6,800,804 B2 | 10/2004 | Igarashi et al. |
| 6,838,776 B2 | 1/2005 | Leal et al. |
| 6,856,007 B2 | 2/2005 | Warner |
| 6,865,084 B2 | 3/2005 | Lin et al. |
| 6,867,480 B2 | 3/2005 | Legaspi, Jr. et al. |
| 6,881,896 B2 | 4/2005 | Ebihara |
| 6,900,383 B2 | 5/2005 | Babb et al. |
| 6,928,719 B2 | 8/2005 | Kim et al. |
| 6,962,869 B1 | 11/2005 | Bao et al. |
| 6,967,403 B2 | 11/2005 | Chuang et al. |
| 6,975,516 B2 | 12/2005 | Asahi et al. |
| 6,992,400 B2 | 1/2006 | Tikka et al. |
| 6,998,532 B2 | 2/2006 | Kawamoto et al. |
| 7,012,323 B2 | 3/2006 | Warner et al. |
| 7,030,469 B2 | 4/2006 | Mahadevan et al. |
| 7,045,385 B2 | 5/2006 | Kim et al. |
| 7,049,682 B1 | 5/2006 | Mathews et al. |
| 7,081,661 B2 | 7/2006 | Takehara et al. |
| 7,125,744 B2 | 10/2006 | Takehara et al. |
| 7,126,218 B1 | 10/2006 | Darveaux et al. |
| 7,161,252 B2 | 1/2007 | Tsuneoka et al. |
| 7,180,012 B2 | 2/2007 | Tsuneoka et al. |
| 7,183,498 B2 | 2/2007 | Ogura et al. |
| 7,186,928 B2 | 3/2007 | Kikuchi et al. |
| 7,187,060 B2 | 3/2007 | Usui |
| 7,294,587 B2 | 11/2007 | Asahi et al. |
| 7,327,015 B2 | 2/2008 | Yang et al. |
| 7,342,303 B1 | 3/2008 | Berry et al. |
| 7,372,151 B1 | 5/2008 | Fan et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,566,955 B2 | 7/2009 | Warner |
| 7,576,415 B2 | 8/2009 | Cha et al. |
| 7,629,674 B1 | 12/2009 | Foster |
| 7,633,170 B2 | 12/2009 | Yang et al. |
| 7,633,765 B1 | 12/2009 | Scanlan et al. |
| 7,643,311 B2 | 1/2010 | Coffy |
| 7,656,047 B2 | 2/2010 | Yang et al. |
| 7,700,411 B2 | 4/2010 | Yang et al. |
| 7,741,151 B2 | 6/2010 | Amrine et al. |
| 7,745,910 B1* | 6/2010 | Olson et al. ............... 257/659 |
| 7,772,046 B2 | 8/2010 | Pagaila et al. |
| 7,799,602 B2* | 9/2010 | Pagaila et al. ............... 438/106 |
| 7,829,981 B2 | 11/2010 | Hsu |
| 7,989,928 B2 | 8/2011 | Liao et al. |
| 8,022,511 B2 | 9/2011 | Chiu et al. |
| 2002/0053724 A1 | 5/2002 | Lai et al. |
| 2002/0093108 A1 | 7/2002 | Grigorov |
| 2004/0020673 A1 | 2/2004 | Mazurkiewicz |
| 2004/0063242 A1 | 4/2004 | Kamezos |
| 2004/0150097 A1 | 8/2004 | Gaynes et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0208702 A1 | 9/2005 | Kim |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0266547 A1 | 11/2006 | Koga |
| 2007/0030661 A1 | 2/2007 | Morris |
| 2007/0241437 A1 | 10/2007 | Kagaya et al. |
| 2008/0042301 A1 | 2/2008 | Yang et al. |
| 2008/0061407 A1 | 3/2008 | Yang et al. |
| 2008/0128890 A1 | 6/2008 | Choi et al. |
| 2008/0174013 A1 | 7/2008 | Yang et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0075428 A1 | 3/2009 | Tang et al. |
| 2009/0102003 A1 | 4/2009 | Vogt et al. |
| 2009/0102033 A1 | 4/2009 | Raben |
| 2009/0152688 A1* | 6/2009 | Do et al. ............... 257/659 |
| 2009/0194851 A1 | 8/2009 | Chiu et al. |
| 2009/0194852 A1 | 8/2009 | Chiu et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0236700 A1 | 9/2009 | Moriya |
| 2009/0256244 A1 | 10/2009 | Liao et al. |
| 2009/0261470 A1 | 10/2009 | Choi et al. |
| 2009/0294928 A1 | 12/2009 | Kim et al. |
| 2009/0302446 A1 | 12/2009 | Lee et al. |
| 2010/0006330 A1 | 1/2010 | Fu et al. |
| 2010/0013064 A1 | 1/2010 | Hsu |
| 2010/0032815 A1 | 2/2010 | An et al. |
| 2010/0109132 A1 | 5/2010 | Ko et al. |
| 2010/0110656 A1 | 5/2010 | Ko et al. |
| 2010/0207257 A1 | 8/2010 | Lee |
| 2010/0207259 A1 | 8/2010 | Liao et al. |
| 2011/0006408 A1 | 1/2011 | Liao |
| 2011/0115059 A1 | 5/2011 | Lee |
| 2011/0115060 A1 | 5/2011 | Chiu et al. |
| 2011/0115066 A1 | 5/2011 | Kim |
| 2011/0127654 A1 | 6/2011 | Weng et al. |

FOREIGN PATENT DOCUMENTS

| | | |
|---|---|---|
| CN | 1774804 A | 5/2006 |
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 08-288686 | 1/1996 |

| | | |
|---|---|---|
| JP | 2003273571 | 9/2003 |
| WO | 2004060034 | 7/2004 |
| WO | WO 2006076613 | 7/2006 |

OTHER PUBLICATIONS

Lee et al. "Semiconductor Device Packages With Electromagnetic Interference Shielding." U.S. Appl. No. 12/622,419, filed Nov. 19, 2009.

Kim et al. "Semiconductor Device Packages With Electromagnetic Interference Shielding." U.S. Appl. No. 12/622,415, filed Nov. 19, 2009.

Chiu et al. "Wafer-Level Semiconductor Device Packages With Electromagnetic Interference Shielding." U.S. Appl. No. 12/622,393, filed Nov. 19, 2009.

Weng et al., "Semiconductor Package and Manufacturing Methods Thereof." U.S. Appl. No. 12/955,782, filed Nov. 29, 2010.

An et al. U.S. Appl. No. 12/432,621, filed Apr. 29, 2009 for "Semiconductor Device Packages With Electromagnetic Interference Shielding." Office Action mailed Apr. 26, 2011.

Ko et al., U.S. Appl. No. 12/388,771, filed Feb. 19, 2009 for "Chip Package and Manufacturing Method Thereof." Office Action mailed Aug. 4, 2011.

Ko et al., U.S. Appl. No. 12/414,996, filed Mar. 31, 2009 for "Chip Package and Manufacturing Method Thereof." Office Actions mailed Jan. 11, 2011 and Jun. 22, 2011.

* cited by examiner

CHIP PACKAGE AND MANUFACTURING METHOD THEREOF

BACKGROUND OF THE INVENTION

1. Field of the Invention

The present invention relates to a semiconductor device, and more particularly to a chip package.

2. Description of Related Art

For most electronic devices or packages, electromagnetic interference (EMI) is a common but undesirable disturbance that may interrupt, obstruct, degrade or limit the effective performance of the devices or the whole circuit.

Accordingly, with the increased demand in packaging of high frequency devices, weights for better EMI shielding are raised. Conventionally, extra shielding plate or ground plate may be utilized according to the related art, which results in an excessive thickness of the device and higher manufacturing costs.

SUMMARY OF THE INVENTION

In view of the foregoing, the present invention is directed to a manufacturing method of a chip package to simplify the manufacturing process.

The present invention is further directed to a chip package with enhanced effectiveness of EMI shielding.

The present invention provides a chip package including a laminate substrate having a plurality of contacts thereon, at least a chip disposed on the laminate substrate, a first shielding layer, a molding compound and a second shielding layer. The first shielding layer is disposed over the laminate substrate, exposing the contacts and the chip. The molding compound encapsulates the chip, the contacts, a portion of the first shielding layer and a portion of the laminate substrate. The second shielding layer is disposed over the molding compound and covering the whole surface of the molding compound.

According to embodiments of the present invention, the first or the second shielding layer can be made of solder materials, either the same or different materials.

According to embodiments of the present invention, the chip is electrically connected to the substrate of the chip package through a plurality of wires or bumps.

The invention further provides a manufacturing method of a chip package. The manufacturing method includes the following steps. First, a substrate having a plurality of contacts and a die attaching region thereon is provided. A first shielding layer is formed over a top surface of the substrate, exposing the contacts and the die attaching region. After fixing at least a chip on the die attaching region of the substrate and bonding the chip, a molding compound is formed over the substrate to encapsulate the chip, the contacts and at least a portion of the first shielding layer. Later, a second shielding layer is formed over the molding compound.

According to one embodiment of the present invention, the first shielding layer is formed by a printing process, while the second shielding layer is formed by a printing process or a plating process.

Based on the above, the first shielding layer disposed on the substrate functions as an EMI shield of the chip package for the underneath EMI radiation. According to the present invention, no extra metal plate is required and a complete EMI shielding is achieved through the first and second shielding layers. Therefore, the chip package of the present invention has better EMI shielding effectiveness and improved performances.

In order to make the aforementioned and other objects, features and advantages of the present invention comprehensible, several embodiments accompanied with figures are described in detail below.

DESCRIPTION OF EMBODIMENTS

Figure 1:
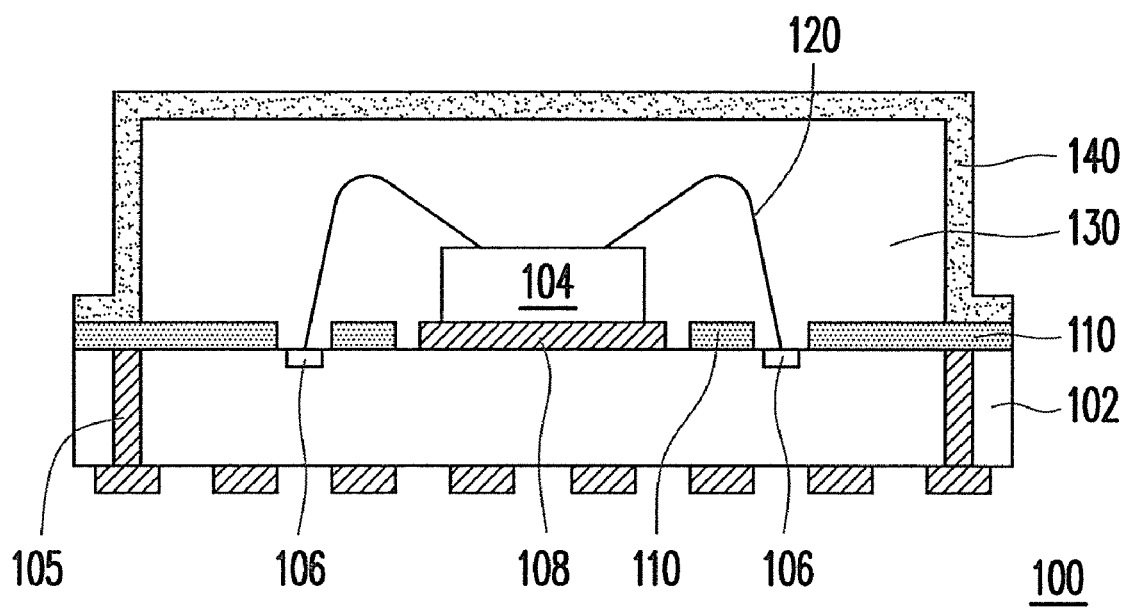
FIG. 1 is a cross-sectional view of a chip package according to an embodiment of the present invention.

FIG. 1 is a cross-sectional view of a chip package according to a preferred embodiment of the present invention. Referring to FIG. 1, the chip package 100 of the present embodiment includes a substrate 102, at least a chip 104, a plurality of contacts 106, a first shielding layer 110, a plurality of wires 120, a molding compound 130 and a second shielding layer 140. The substrate 102 can be a laminated substrate, for example, a two-layered laminated PCB substrate. The chip 104 can be a semiconductor chip, for example, a radio-frequency (RF) chip. For example, the material of the contacts 106 may be copper, aluminum, or alloys thereof. For example, the material of the first/second shielding layer may be a solder material, and the material of the first or second shielding layer may be different or the same. The contacts 106 are disposed on the top surface of the substrate 102 and around the die pad 108. The first shielding layer 110 is disposed over the top surface of the substrate 102, exposing the contacts 106 and the die pad 108. The chip 104 disposed on the die pad 108 is electrically connected to the contacts 106 of the substrate 102 through the wires 120. The molding compound 130 encapsulates the chip 104, the contacts 106, the wires 120, a portion of the substrate 102 and a portion of the first shielding layer 110. Besides, the second shielding layer 140 is disposed over the molding compound 130, covering the top surface and four side walls of the molding compound 130. In addition, the second shielding layer 140 covers the ground vias 105 of the substrate 102, and the second shielding layer 140 is electrically connected to the ground via 105 and grounded. It should be noted that if the molding compound 130 completely encapsulates the chip 104 and the substrate 102, the first shielding layer 110 covers the ground vias 105 and is grounded.

In the chip package 100 of the present embodiment, the first shielding layer disposed on the substrate functions as an EMI shield, particularly protecting the package from the EMI radiation from the underneath radiation sources. Thus, in comparison with the chip package provided by the related art, there is no need for the chip package 100 of the present embodiment to include an extra metal plate and a thinner package structure can be provided.

The first and second shielding layers can help improve the EMI shielding of the chip package. Especially, the first shielding layer covering the top surface of the substrate can help shield the EMI radiation from the bottom of the chip package. As the second shielding layer of the chip package covers the upper part of the chip package (exposed surfaces of the molding compound) and the first shielding layer protects the chip package from underneath underside EMI radiation, the effectiveness of the EMI shielding for the chip package is reinforced.

In the present embodiment, the edge of the molding compound may be aligned with the edges of the contacts or the ground vias. Besides, the chip package of the present embodiment may further include bumps on the back surface of the substrate for further connection. In principle, the chip package may be a top package in stacked package structures or package in package structures or a part of a system-in-package (SiP) structure. Moreover, in addition to the active component, the chip package of the present invention may further include passive components, including resistors, capacitors, and inductors.

Figure 2A:
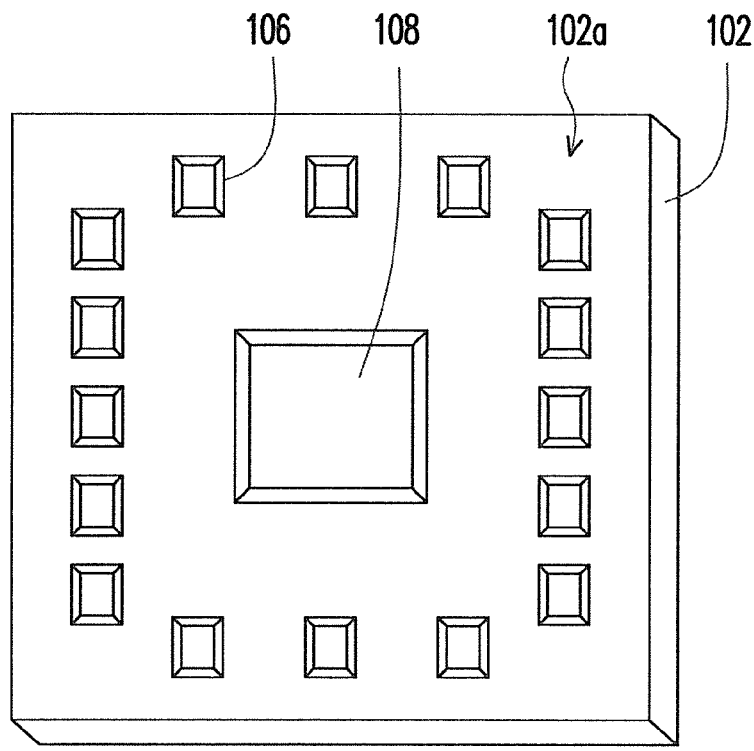
FIGS. 2A through 2E are schematic views showing a manufacturing method of the chip package according to the preferred embodiment of the present invention.
Figure 2B:
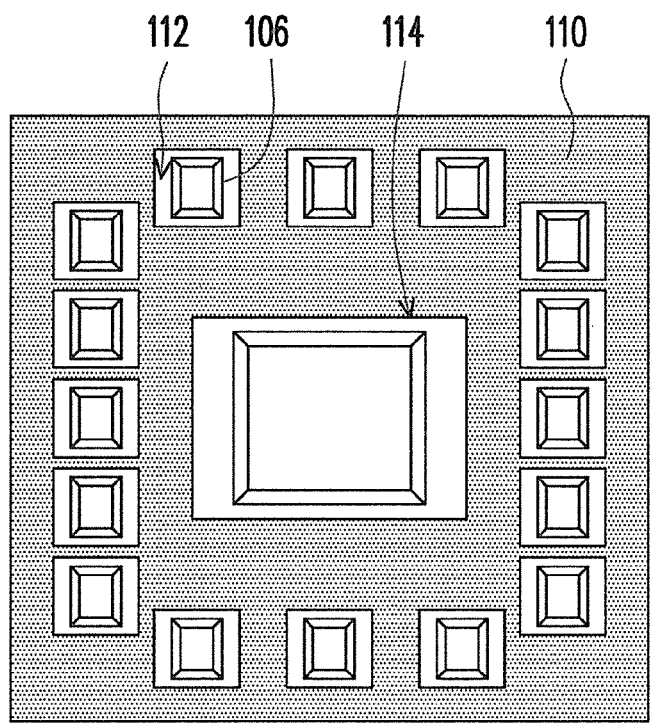
Figure 2C:
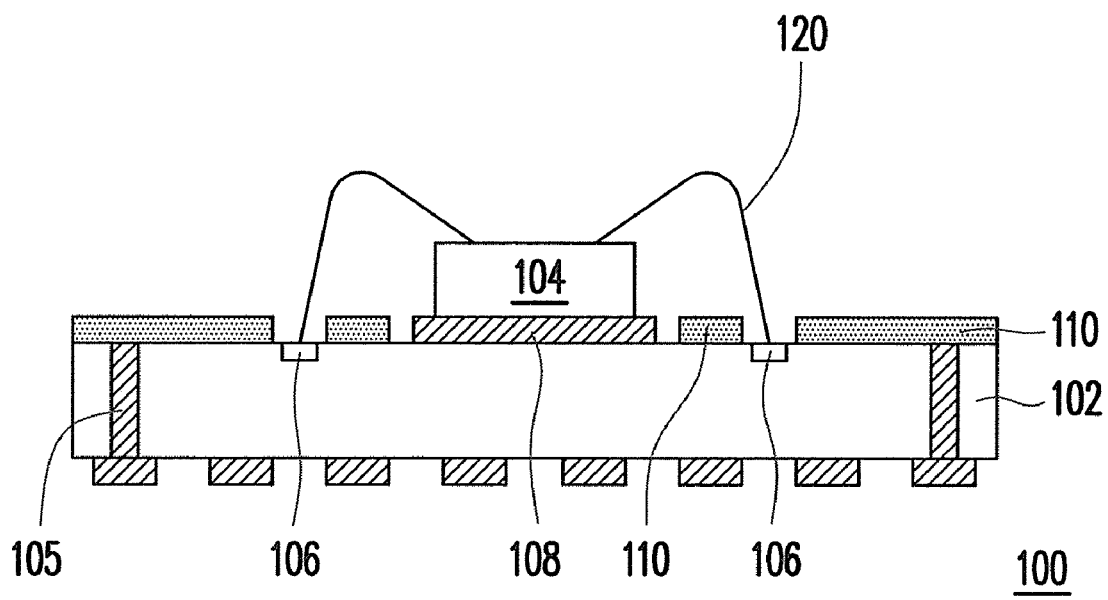
Figure 2D:
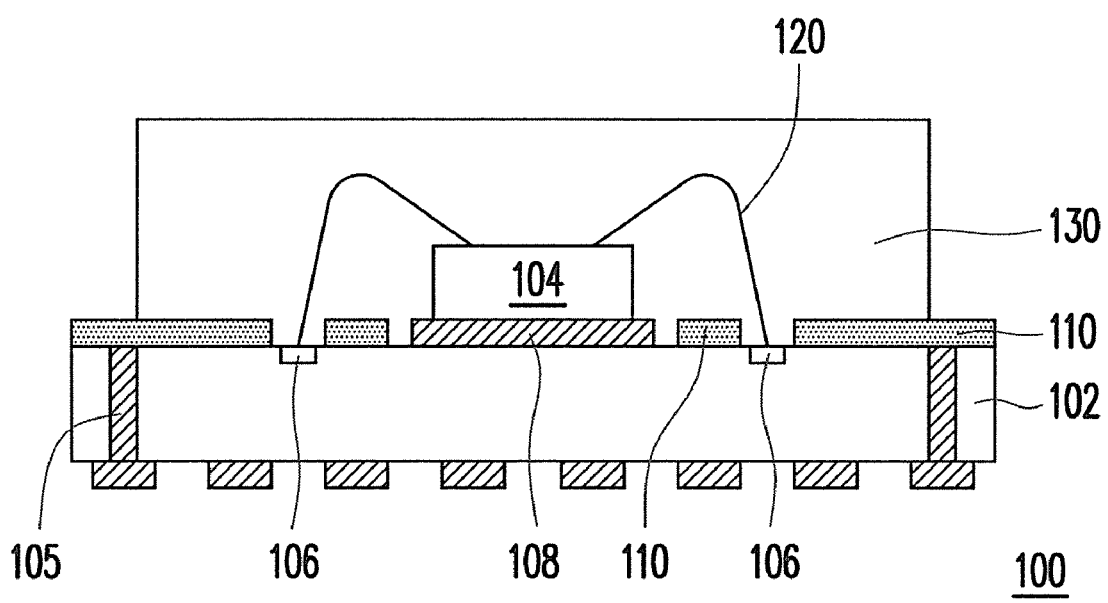
Figure 2E:
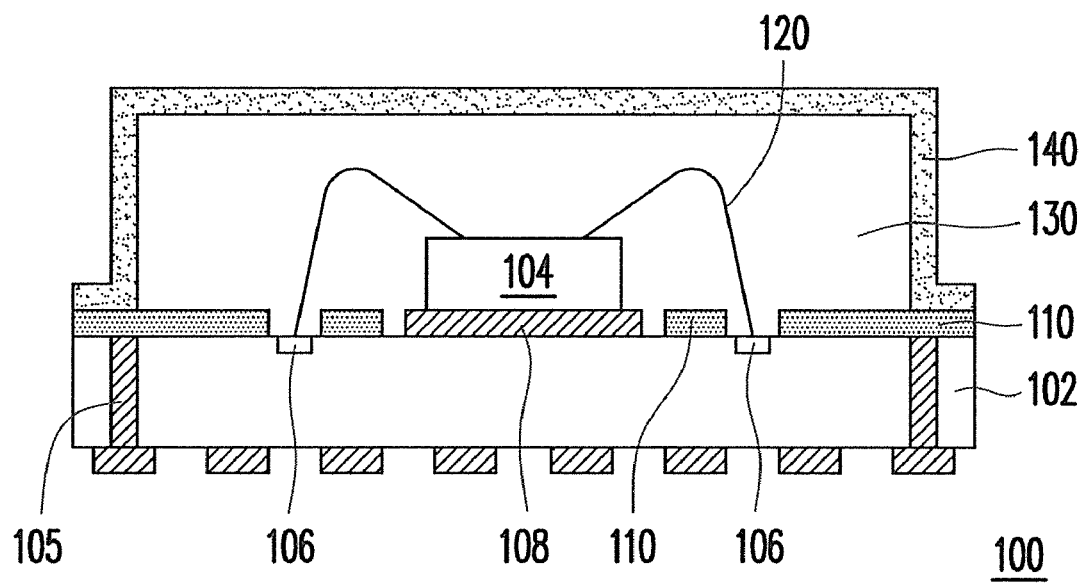

FIGS. 2A through 2E are schematic views showing a manufacturing method of the chip package according to the embodiment of the present invention. FIGS. 2A to 2B are shown in top views and FIGS. 2C-2E are shown in exemplary cross-sectional views.

Referring to FIG. 2A, a substrate 102 having at least a die pad 108 and a plurality of contacts 106 is provided. The contacts 106 are arranged around the die pad 108.

Referring to FIG. 2B, a first shielding layer 110 is formed over the top surface 102a of the substrate 102. The material of the first shielding layer 110 is a solder material, for example. The first shielding layer 110 is formed by screen printing method, for example. The underlying contacts 106 are exposed by the corresponding first openings 112 of the first shielding layer 110, while the die pad 108 is exposed by the second opening 114 of the first shielding layer 110. In general, the sizes of the openings are larger than those of the correspondingly exposed components, so as to prevent possible shorts. In other words, the first shielding layer 110 should be completely separated from the contacts 106 to prevent a short circuit from occurring. However, under certain circumstances, the size of the second opening 114 may be almost equivalent to that of the die pad 108.

Referring to FIG. 2C, at least a chip 104 is disposed on the die pad 108 and a plurality of wires 120 are formed for electrically connecting the chip 104 and the contacts 106 of the substrate 102.

Referring to FIG. 2D, a molding process is carried out to form a molding compound 130 on the substrate 102 to encapsulate, the chip 106, the contacts 106 and at least a portion of the first shielding layer 110.

Referring to FIG. 2E, a second shielding layer 140 is formed over the exposed surface of the molding compound 130. The material of the second shielding layer 140 is a solder material, for example. The second shielding layer 140 is formed by screen printing method or a plating method, for example. Optionally a half cutting process may be performed after forming the molding compound 130 and before forming the second shielding layer 140.

Finally, a singulation process is performed to obtain the chip package 100.

Figure 3:
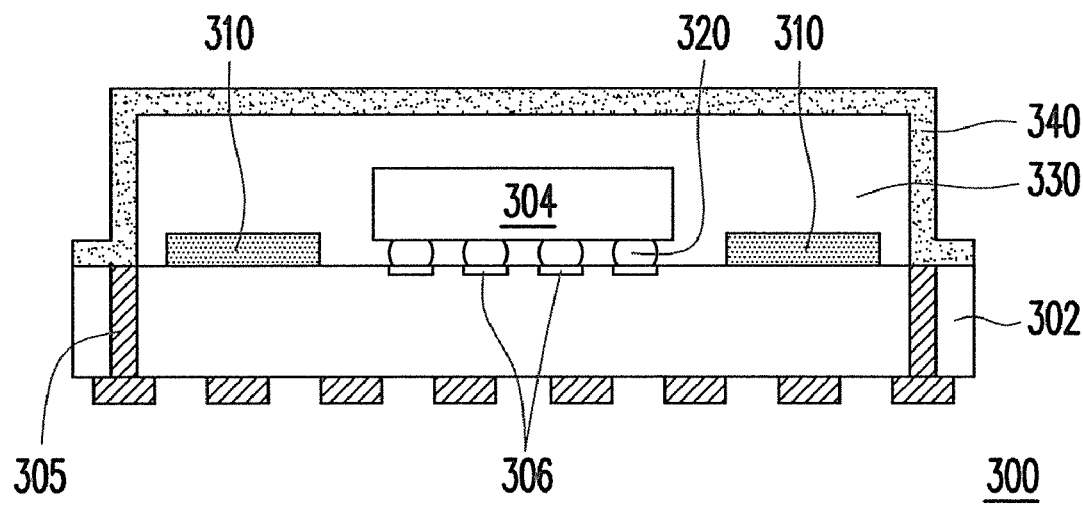
FIG. 3 is a cross-sectional view of a chip package according to another embodiment of the present invention.

Alternatively, the chip package of the present invention may include a chip electrically connected to the substrate through flip chip bonding technology, rather than wire bonding technology described in the previous embodiment. As shown in FIG. 3, the major differences lie in that a chip package 300 further includes a chip 304 electrically connected to the contacts 306 of the substrate 302 through bumps 320 sandwiched there-between. The first shielding layer 310 is disposed over the top surface of the substrate 302 but exposing the flip-chip area. That is, the first shielding layer 310 is completely separated from the perimeter of the flip-chip area, to prevent a short circuit between the first shielding layer and the contacts 306/the bumps 320 from occurring.

The molding compound 330 encapsulates the chip 304, the contacts 306, the bumps 320, a portion of the substrate 302 and the first shielding layer 310. Besides, the second shielding layer 340 is disposed over the molding compound 330, covering the top surface and four side walls of the molding compound 330. In addition, the second shielding layer 340 covers the ground vias 305 of the substrate 302, and the second shielding layer 340 is electrically connected to the ground via 305 and grounded. It should be noted that if the molding compound 330 completely encapsulates the chip 304 and the substrate 302, the first shielding layer 310 covers the ground vias 305 and is grounded.

In summary, the first and second shielding layers can efficiently shelter the chip package of the present invention from the outside EMI radiation, thus enhancing the EMI shielding. Following the manufacturing processes disclosed in the present invention, it is possible to adapt a thinner laminate substrate without an extra ground plane and the thickness or volume of the chip package structure can be more compact. Accordingly, such design is compatible with the packaging of high frequency devices, particularly, radio frequency devices.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A chip package, comprising:
a substrate having a plurality of contacts, a die pad, and a ground path;
a chip disposed on the die pad;
a first shielding layer;
a package body encapsulating the chip and a portion of the first shielding layer; and
a second shielding layer disposed over the package body; wherein:
the first shielding layer defines a plurality of first openings that expose the contacts; and
the first shielding layer substantially covers a first surface of the substrate wherein the first shielding layer is substantially planar.

2. The chip package as chinned in claim 1, wherein the plurality of first openings are larger than the correspondingly exposed contacts.

3. The chin package as claimed in claim 1, wherein:
the first shielding layer defines a second opening exposing the die pad.

4. The chip package as claimed in claim 3, wherein the second opening is at least as large as the die pad.

5. The chip package as claimed in claim 1, wherein:
the first shielding layer and the second shielding layer are electrically connected to the ground path; and
the ground path comprises at least one ground via.

6. The chip package as claimed in claim 5, wherein the first shielding layer covers the ground via of the substrate.

7. The chip package as claimed in claim 1, wherein:
a material of the first shielding layer is a solder material; and
a material of the second shielding layer is a solder material.

8. The chip package as claimed in claim 1, wherein the second shielding layer conformally covers the package body.

9. A chip package, comprising:
a substrate having a top surface and a back surface opposite the top surface;
a plurality of contacts disposed on the top surface of the substrate;
a chip disposed on the top surface of the substrate;

a first shielding layer disposed over the top surface of the substrate and having a plurality of first openings, wherein each of the plurality of openings circumscribes and exposes a corresponding one of the plurality of contacts;

a molding compound encapsulating a portion of the first shielding layer; and a second shielding layer disposed over an exterior surface of the molding compound.

10. The chip package as claimed in claim 9, wherein the substrate further has a ground via, and the first shielding layer is electrically connected to the ground via.

11. The chip package as claimed in claim 9, wherein the first shielding layer substantially covers the top surface of the substrate while exposing the contacts.

12. The chip package as claimed in claim 9, wherein the first shielding layer is substantially planar.

13. The chip package as claimed in claim 9, wherein:

the first shielding layer defines a second opening that exposes the chip; and the first shielding layer substantially covers the top surface of the substrate while exposing the contacts and the chip.

14. A chip package, comprising:

a substrate having a ground path, a top surface, and a back surface opposite to the top surface;

a plurality of contacts disposed adjacent to the top surface of the substrate;

a chip disposed on the top surface of the substrate;

a first shielding layer:
 disposed over the top surface of the substrate;
 circumscribing and exposing the contacts and the chip; and
 disposed between the chip and at least one of the contacts;

a molding compound encapsulating a portion of the first shielding layer; and a second shielding layer disposed over the molding compound;

wherein the first shielding layer and the second shielding layer are electrically connected to the ground path wherein the first shielding layer defines a plurality of openings, wherein each of the plurality of openings circumscribes and exposes a corresponding one of the contacts.

15. The chip package as claimed in claim 14, wherein the first shielding layer is substantially planar.

16. The chip package as claimed in claim 14, wherein the ground path includes a ground via and the ground via, the first shielding layer, and the second shielding layer form a common ground.

17. A chip package, comprising:

a substrate having a ground path, a top surface, and a back surface opposite to the top surface;

a plurality of contacts disposed adjacent to the top surface of the substrate;

a first shielding layer:
 disposed over the top surface of the substrate;
 circumscribing and exposing the contacts and the chip; and
 disposed between the chip and at least one of the contacts;

a molding compound encapsulating a portion of the first shielding layer; and a second shielding layer disposed over the molding compound;

wherein the first shielding layer and the second shielding layer are electrically connected to the ground path, wherein the first shielding layer substantially covers the top surface of the substrate while exposing the contacts and the chip.

18. A chip package, comprising:

a substrate having a plurality of contacts, a die pad, and a ground path;

a chip disposed on the die pad;

a first shielding layer;

a package body encapsulating the chip and a portion of the first shielding layer; and a second shielding layer disposed over the package body;

wherein:
 the first shielding layer defines a plurality of first openings that expose the contacts; and
 the first shielding layer substantially covers a first surface of the substrate, wherein each of the plurality of openings circumscribes a corresponding one of the contacts.

* * * * *